(12) United States Patent
Hoogenboom et al.

(10) Patent No.: US 9,715,992 B2
(45) Date of Patent: Jul. 25, 2017

(54) INTEGRATED OPTICAL AND CHARGED PARTICLE INSPECTION APPARATUS

(71) Applicants: DELMIC B.V., JD Delft (NL); Jacob Pieter Hoogenboom, De Meern (NL); Pieter Kruit, Delft (NL); Nalan M. SC Liv, Rotterdam (NL); Aernout Christiaan Zonnevylle, Dordrecht (NL)

(72) Inventors: Jacob Pieter Hoogenboom, De Meern (NL); Pieter Kruit, Delft (NL); Nalan Liv, Rotterdam (NL); Aernout Christiaan Zonnevylle, Dordrecht (NL)

(73) Assignee: DELMIC B.V., Delft (NL)

( * ) Notice: Subject to any disclaimer, the term of this patent is extended or adjusted under 35 U.S.C. 154(b) by 0 days.

(21) Appl. No.: 14/390,095

(22) PCT Filed: Apr. 2, 2013

(86) PCT No.: PCT/NL2013/000019
§ 371 (c)(1),
(2) Date: Oct. 2, 2014

(87) PCT Pub. No.: WO2013/151421
PCT Pub. Date: Oct. 10, 2013

(65) Prior Publication Data
US 2015/0108350 A1 Apr. 23, 2015

(30) Foreign Application Priority Data
Apr. 2, 2012 (NL) ...................................... 1039512

(51) Int. Cl.
*H01J 37/22* (2006.01)
*G01C 21/32* (2006.01)
(Continued)

(52) U.S. Cl.
CPC ............ *H01J 37/222* (2013.01); *G01C 21/32* (2013.01); *H01J 37/22* (2013.01); *H01J 37/226* (2013.01);
(Continued)

(58) Field of Classification Search
CPC .......... H01J 37/22; H01J 37/222; H01J 37/26; H01J 37/261; H01J 37/268;
(Continued)

(56) References Cited

U.S. PATENT DOCUMENTS 5,483,065 A * 1/1996 Sato ...................... H01J 37/256
250/310
6,303,930 B1 10/2001 Hagiwara
(Continued)

FOREIGN PATENT DOCUMENTS

JP 09283073 A * 10/1997
JP 9283073 A 10/1997
(Continued)

OTHER PUBLICATIONS

Brown et al., "The use of markers for correlative light electron microscopy", Protoplasma, 2010, vol. 244, pp. 91-97.
(Continued)

*Primary Examiner* — David E Smith
(74) *Attorney, Agent, or Firm* — Young & Thompson

(57) ABSTRACT

An apparatus for inspecting a sample, is equipped with a charged particle column for producing a focused beam of charged particles to observe or modify the sample, and an optical microscope to observe a region of interest on the sample as is observed by the charged particle beam or vice versa. The apparatus is accommodated with a processing unit adapted and equipped to represent an image as generated with the column and an image as generated with the microscope. The unit is further adapted to perform an
(Continued)

alignment procedure mutually correlating a region of interest in one of the images, wherein the alignment procedure involves detecting a change in the optical image as caused by the charged particle beam.

17 Claims, 3 Drawing Sheets

(51) Int. Cl.
  *H01J 37/28* (2006.01)
  *G01C 21/34* (2006.01)
(52) U.S. Cl.
  CPC ............ *H01J 37/228* (2013.01); *H01J 37/28* (2013.01); *G01C 21/3484* (2013.01); *H01J 2237/221* (2013.01); *H01J 2237/226* (2013.01); *H01J 2237/24475* (2013.01); *H01J 2237/2806* (2013.01)
(58) Field of Classification Search
  CPC ........... H01J 2237/221; H01J 2237/226; H01J 2237/24475; H01J 2237/2806; G01N 21/62; G01N 21/63; G01N 21/64
  See application file for complete search history.

(56) References Cited

U.S. PATENT DOCUMENTS

| 2008/0073527 | A1  | 3/2008  | Nakazawa et al. |              |
|--------------|-----|---------|-----------------|--------------|
| 2011/0133066 | A1* | 6/2011  | Nozoe           | H01J 37/265  |
|              |     |         |                 | 250/252.1    |
| 2011/0174972 | A1* | 7/2011  | Duden           | G01N 23/203  |
|              |     |         |                 | 250/307      |
| 2012/0025075 | A1* | 2/2012  | Moore           | G01N 23/04   |
|              |     |         |                 | 250/307      |
| 2012/0104250 | A1* | 5/2012  | Bean            | G02B 21/367  |
|              |     |         |                 | 250/307      |
| 2012/0193530 | A1* | 8/2012  | Parker          | G01N 21/6428 |
|              |     |         |                 | 250/307      |
| 2013/0140459 | A1* | 6/2013  | Galloway        | H01J 37/02   |
|              |     |         |                 | 250/310      |
| 2013/0335817 | A1* | 12/2013 | Isobe           | G01N 23/2251 |
|              |     |         |                 | 359/363      |

FOREIGN PATENT DOCUMENTS

| WO | 0127967 A1    | 4/2001 |
| WO | 2012008836 A2 | 1/2012 |

OTHER PUBLICATIONS

International Search Report, dated Nov. 7, 2013, from corresponding PCT application.

\* cited by examiner

3A    3B    3C
FIG. 3
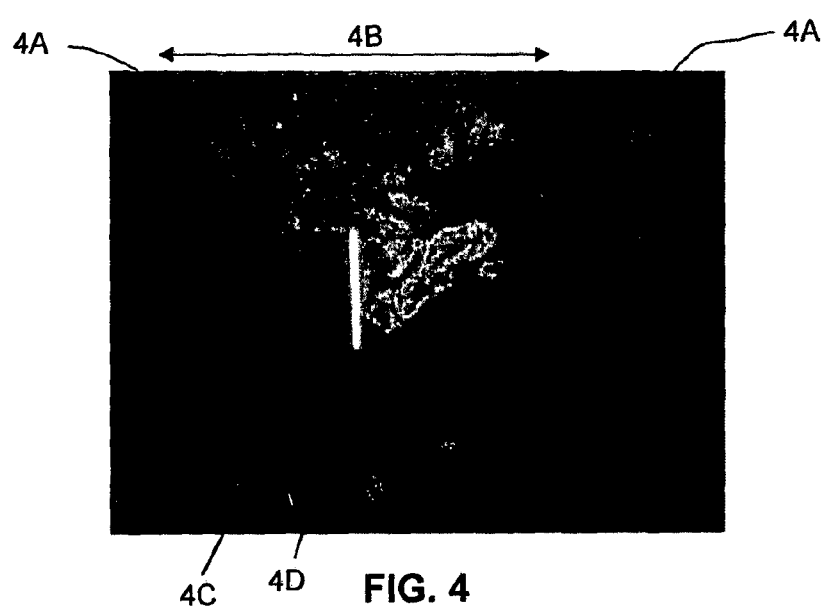
4C  4D  FIG. 4
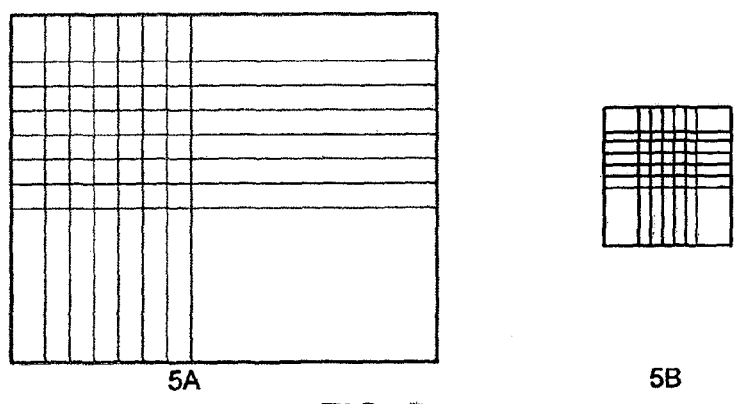
5A            5B
FIG. 5

INTEGRATED OPTICAL AND CHARGED PARTICLE INSPECTION APPARATUS

BACKGROUND OF THE INVENTION

1. Field of the Invention

The present invention relates to an improvement in a so-called integrated inspection apparatus, featuring the integration of a scanning electron microscope (SEM) and light microscope optics. The improvement in particular relates to extension in functionality of such integrated systems, amongst others towards a new and simplified method of operating such systems.

In this respect, it is noted that information obtained from images with light microscopy and electron microscopy is to a large extent complementary. With a light microscope different objects can be seen and inspected in a specimen in different colors, which allows for identification of part or whole of the composition of this specimen. Instead of directly observing color from a constituent of the specimen, very often specific color markers are attached, such as fluorophores or autofluorescent proteins, to a specific non-colored constituent for identification.

With an electron microscope, all constituents of a specimen can be imaged at very small detail (high resolution), much smaller than with a light microscope, but the ability to identify constituents based on color is absent. In correlative light-electron microscopy, therefore, users try to obtain images from the same area of a specimen, the so called Region of Interest or ROI for short, with both the light and the electron microscope. A very accurate and quick way of doing this, is by using an integrated microscope wherein both types of microscope or parts thereof are to a more or less integrated extend contained in a single apparatus.

2. Description of the Related Art

Such an integrated system is known in the art, e.g. from the short technical note "Specimen stage incorporating light microscopical optics for a Cambridge S180 scanning electron microscope" by Wouters et al in J. of Microscopy Vol. 145, Feb. 1987, pp237-240. Recent improvements of that principle are provided by Applicant in patent publication WO2012008836 and is in line with the present invention generally described as an inspection apparatus provided with an optical microscope and an ion- or electron microscope, equipped with a source for emitting a primary beam of radiation to a sample in a sample holder. The apparatus comprises a detector for detection of secondary radiation backscattered from the sample and induced by the primary beam. The optical microscope is equipped with a light collecting and recording device such as a CCD camera or other light recording device, to receive in use luminescence light emitted by the sample.

In correlative microscopy, users aim to image the same area of a sample with both the light and the electron microscope. The problem in this practice is that both images have different magnification, possibly both in x and y, and rotation orientation. Also, the images have different contrast, which means that some features that are visible in one image cannot be seen in the other, and vice versa. Known methods to overcome this problem are to put the samples on a microscope slide, or support grid, that has markers which can be recognized in both images. Another method is to inject markers into the sample. See for example, "The use of markers for Correlative Microscopy" Brown & Verkade, Protoplasma, 244, pp. 91-94, 2010

One of the essential points of correlative microscopy, i.e. the process of inspecting the same sample with two different investigative methods, is overlaying datasets of the two methods as precisely and accurate possible. In the case of correlative light-electron microscopy, this means an x-, y-, and occasional z-, overlay between an optical image and an electron image. The process of achieving this overlay is non-trivial and may be cumbersome.

BRIEF SUMMARY OF THE INVENTION

In the present invention a fundamental improvement is made in the practice of correlative microscopy, by an at hindsight relatively simple measure that obviates the specific manners for doing so as known to date. The measure according to the invention reduces complexity of correlative inspection, improves productivity and/or improves the quality and accuracy of inspection in that image. Both inspection methods can be compared simultaneously without undue complicating measures to either the apparatus or the sample. According to the present invention, the measure towards obtaining these advantages requires detecting a change in the optical image caused by the electron beam and using the coordinates for correlation of the two images. Such detection and correlation can be performed in automated manner.

At such alignment of two images of the two systems of an integrated inspection apparatus, i.e. through the modification of the optical image by the electron beam, three types of signal modifications may be applied according to the invention. The fluorescent signal may be made brighter and/or darker, or cathodoluminescence light, i.e. light generated by the electron beam falling on the sample, may be used. The latter manner requires instantaneous observation as preferred by the present invention, e.g. using an integrated scanning electron-optical microscope. Modification in the fluorescent signal can however also be performed in a so-called shuttling or transfer system, where the user switches between an independent optical microscope and independent electron microscope and vice versa or in an integrated microscope where the two modalities are still physically separated and thus transfer of the sample or sample stage within the microscope is needed.

A requirement for observation of the electron beam signal in the optical image is not trivial as the camera of the optical system part is often, in some cases even automatically, switched off during operation of the electron microscope. Hence the improvement by the invention also involves that in operation of the apparatus, both microscope systems are simultaneously switched on, in particular including the camera of the optical microscope system. In second instance, the improvement involves tweaking or a tweaking process of the camera in such a manner that the change in brightness or darkness is detected by human or automated intervention. It is remarked that the invention recognizes that so called charged particle microscopy in practice often is reduced to either of electron or ion beam microscopy, i.e. inspection, and that wherever ion or electron is denoted in the present description, it may in all cases be changed for the other.

The invention hence relates to an apparatus for inspecting a sample, provided with a charged particle microscope having a column for producing a focused beam of charged particles to observe or modify the sample, and an optical microscope to observe a region of interest on the sample as is observed by the charged particle beam or vice versa, the apparatus accommodated with a detection and processing unit adapted and equipped for acquiring and representing an image as generated with said charged particle and said optical microscope, the unit further adapted for performing an image alignment procedure mutually correlating the image coordinate systems of said images wherein the apparatus is adapted for using a detection of a change in the optical image as caused therein by the charged particle beam for correlating said images. Such change may either be an increase in brightness at the position of the charged particle beam as may be seen, at least detected in the optical image, or a decrease in brightness, such as a darkening of a part of the optical image at the position of the charged particle beam was.

It is remarked that such change may be a persistent effect, still detectable after the electron beam has been switched off. Hence the adaptation may as well be provided in an apparatus for correlating images acquired by an independent electron and optical microscope, i.e. correlation may also be realized in a manner according the invention in a system where the correlation is found after shuttling the sample. It may be clear that in a further elaboration the charged particle beam is scanned to form a pattern in the optical image. This can e.g. take the form of scanning at two or more separate locations, e.g. to demarcate an e.g. rectangular area. According to yet a further elaboration, the pattern consists of at least two sub-patterns at the corners of the electron image. By way of yet further elaboration, the apparatus is adapted for selecting a region of interest in either of the images of the two microscope systems for inspection of said area by the other system while the sample is maintained in place in the apparatus. The alignment procedure may involve "clicking" a pointer in the optical image as displayed on a computer screen at the position of the electron beam at two or more locations. According to yet further specification, the position of the electron microscope image can subsequently be indicated in the optical image by drawing a "box".

Preferably, the procedure involves an automated, in particular software based, recognition and interpretation of the change in the optical image caused by the electron beam. In particular, the position of such electron beam caused changes is calculated with a precision that is better than the optical resolution, preferably using the determination of the center of mass of the changes. In again further development, said change in the optical image caused by the electron beam is used to calibrate the magnification of the optical image or the absolute dimensions in the image. It is noted that the correlation according to the present invention may be determined and stored by the processing unit while the sample is maintained in place in the apparatus. It is further remarked that the term correlating may in the present description be explained to mean that the relative coordinate systems of the charged particle image and the optical image are known with respect to, and in the present invention by means of the sample, in particular by means of a change therein.

It may be clear from the preceding and the rest of the present description that the present invention more in general as well relates to a method for aligning, i.e. correlating the charged particle microscope image and the optical image in an apparatus for inspecting a sample, said apparatus equipped with a charged particle column for producing a focused beam of charged particles to observe or modify the sample, and an optical microscope to simultaneously observe the same region of interest on the sample as is observed by the charged particle beam, and which method involves the detection of a change in the optical image caused by the charged particle beam. Such alignment may be performed on one area on one sample and is extrapolated to the alignment on another area or on another sample. Alignment parameters thereof for different z-positions of a sample are stored, such as in computer memory, and retrieved when the sample is positioned on the corresponding z-position. The invention may favorably involve the use of an alignment sample with high luminescence, such as YAG. Also, the method of alignment may be used to correlate images acquired by an independent electron and optical microscope.

BRIEF DESCRIPTION OF THE DRAWINGS

Various aspects of the invention and certain examples of embodiments of the invention are illustrated in the drawings in which:

FIG. 3 illustrates the operation of the present invention by way of three screen shots 3A, 3B and 3C;

FIG. 4 illustrates the present invention, by way of a screen shot illustrating three types of changes: overall brightening up of the optical image as in the left two third of the image, complete darkening as in the central, rectangular part and a large increase in brightness due to cathodoluminescence in a white stripe adjoining the rectangular part;

FIG. 5 is a schematic illustration of the problem in finding a correct relative position;

DESCRIPTION OF ILLUSTRATIVE EMBODIMENTS

Figure 1:
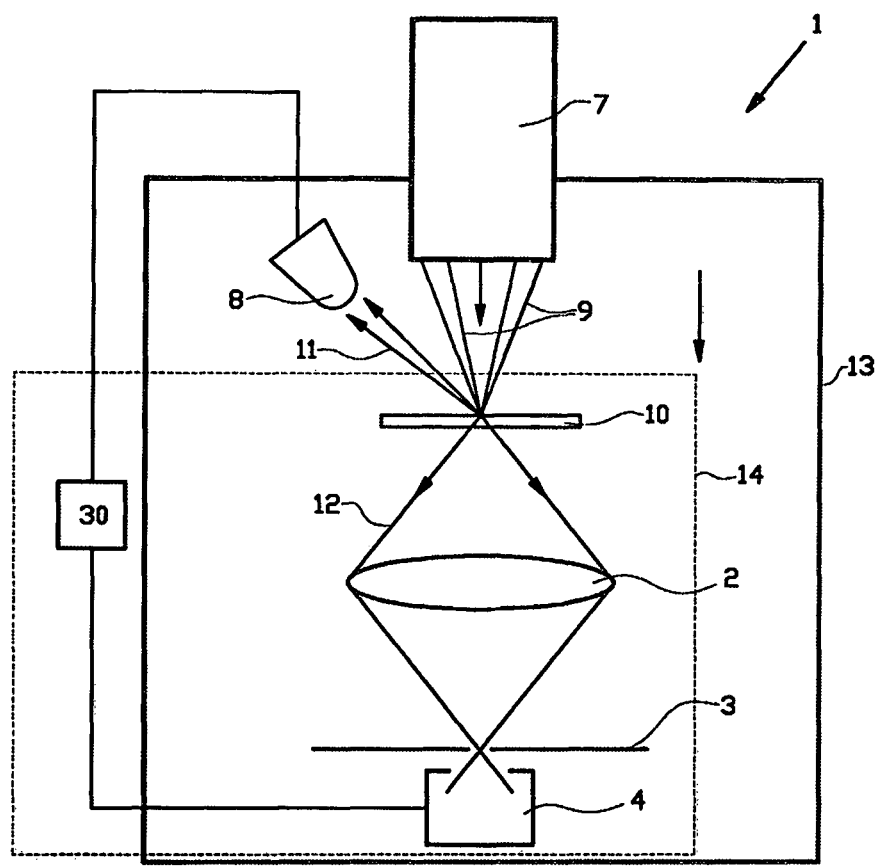
FIG. 1 schematically depicts a basic design of an apparatus as typically improved by the present invention.

By way of exemplifying a typical context of the present invention, a principle and relatively simple set up of a so-called optical SEM combination as known from the prior art will be provided. This example however by no means excludes any known or yet unknown variation or alternative thereof. Hence, with reference first to FIG. 1, the basic design of such an inspection apparatus 1 of the invention is explained. It comprises in combination at least an optical microscope 2, 3, 4 and a charged particle such as an ion- or electron microscope 7, 8 equipped with a source 7 for emitting a primary beam 9 of radiation to a sample 10 in a sample holder. The apparatus may comprise a detector 8 for detection of secondary radiation 11 backscattered from the sample 10, or emitted, transmitted, or scattered from the sample 10 and possibly induced by the primary beam 9. The optical microscope 2, 3, 4 is equipped with an light collecting device 2 to receive in use luminescence light 12 emitted by the sample 10 and induced by the primary beam 9 of radiation and to focus it on a photon-detector 4. The light collecting device 2 may be an objective, a mirror or a glass fiber. It may also consist of a plurality of devices to arrange for collecting and focusing of the concerning luminescence light that is emitted by the sample 10, e.g. using a known per se CCD camera. In the present example the optical microscope 2, 3, 4 is of the confocal type having a pinhole 3 between the objective 2 and the photon-detector 4. In this embodiment the optical microscope 2; 3, 4 is placed entirely inside the vacuum chamber 13 of the ion- or electron microscope 7, 8. The closed dashed line 14 encircles those parts of the inspection apparatus 1 of the invention that may all or some of them be mounted on the (replaceable) door of the vacuum chamber 13, notably the sample holder for the sample 10, the light collecting device 2, the pinhole 3, and the photon-detector 4. This particular construction enables an easy retrofit or completion of an existing charged particle microscope according to prior art in order to convert it into an inspection apparatus according to the integrated type as is subject to the present invention.

In FIG. 1, a processing unit 30, alternatively denoted controller is provided in simplified form, however known per se and useable as an automation unit, e.g. in the form of a computer, including personal computer provided with dedicated software, implementing one or more methods of use of the inspection apparatus. The controller 30 may typically be provided with one or more screens, e.g. one screen or screen part for depicting the recorded optical image, and the other or another part of the same screen depicting an image, in particular of the same object, i.e. substrate, recorded via the charged particle part of the inspection apparatus. Each of these images are in the known inspection apparatuses provided with their own coordinate system. In the known inspection apparatuses, e.g. as described above, the primary beam may influence the luminescence light, emitted by a marker in the sample. It may be the case that the primary beam destroys the marker, thereby preventing the marker from emitting luminescence light. This may generally be the case with organic fluorophores or other molecular light emitting markers. A marker may also be used that responds differently to the primary beam. For example, markers may comprise semiconductor nanocrystals (SNC), or so-called quantum dots (QD). SNC are tiny inorganic crystalline particles, while most QD are particles containing an inorganic crystalline core surrounded by one or multiple inorganic or organic shells of a different material or composition. It may also generally be the case that the primary beam changes the environment, e.g. the substrate, of the marker, which leads to the marker emitting more or less light, i.e. appearing brighter or dimmer in the image. In the following alternative methods are proposed of correlating the "charged particle image", i.e. image developed, i.e. generated by the processing unit and the charged particle part of the apparatus, to the "optical image", i.e. the image developed, i.e. generated by the processing unit and the optical part of the apparatus.

Improved Optical SEM Inspection Apparatus

Figure 2:
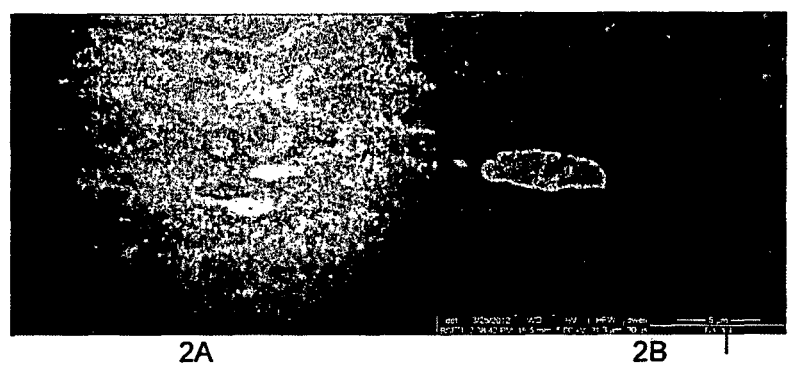
FIG. 2 provides two screen images 2A and 2B each containing the same ROI, and illustrating the problem of correlating the two.

FIG. 2 depicts a light optical image A, and a SEM image B as may typically be derived from e.g. two separate screens or screen parts from a common sample, e.g. as described above or e.g. as in a JEOL ClairScope™ apparatus, a so called Shuttle&Find™ apparatus or any other known apparatus for dual manner of sample inspection. FIG. 2 illustrates the problem: where exactly does image B fit in image A? The magnification, the rotation, contrast, contents and color of image B are different from those in image A.

FIG. 3 illustrates the use of an electron beam for solving the above problem in a new, elegant manner, requiring the two systems to be switched on simultaneously and requiring manipulating the optical image detection system towards detecting a representation of the electron beam in the optical image. To this end the figure depicts a light optical image 3A, a SEM image 3B of the same object, and the optical image 3C of image 3A in which a change is caused by the electron beam.

FIG. 4 depicts a light optical image with three different changes caused by the electron beam. Sections 4A, each outside a section 4B represent a non-modified image part. The large lighter square part 4B shows where the charged particle beam was before the optical image was acquired and enhanced the brightness of the optical image. The smaller rectangle 4C shows where the beam was and deposited a larger dose of electrons than in section 4B and decreased the brightness in the optical image, whereas the bright vertical line 4D shows where the electron beam is scanned during the time that the optical image was acquired.

FIG. 5: The lines of the larger FIG. 5A depict the coordinate system of the light optical image and the position of the pixels. The lines of the smaller FIG. 5B depict the same for the electron image. The problem is to find the correct relative position.

Figure 6:
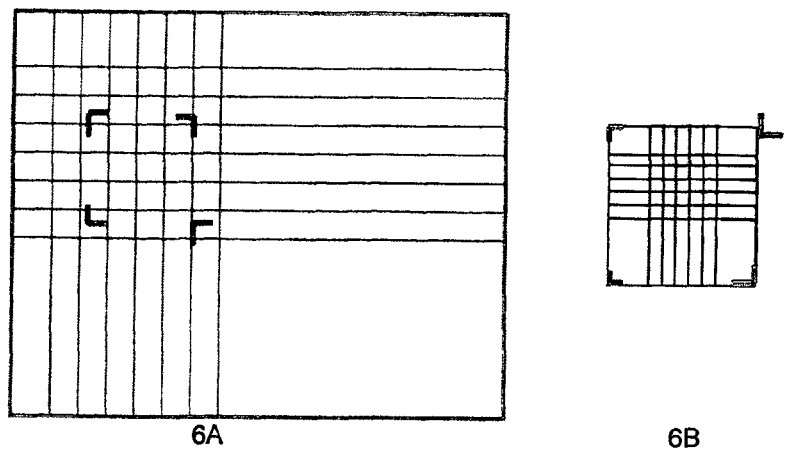
FIG. 6 schematically illustrates a particular manner of using the E-beam for correlation of images of the two microscope systems.

FIG. 6: A pattern created by the electron beam, seen in the electron beam image 6B on the right, can also be observed in the optical image 6A depicted on the left and used for the correlation of the two images. In this example the electron image needs to be rotated over 90° to the right.

Figure 7:
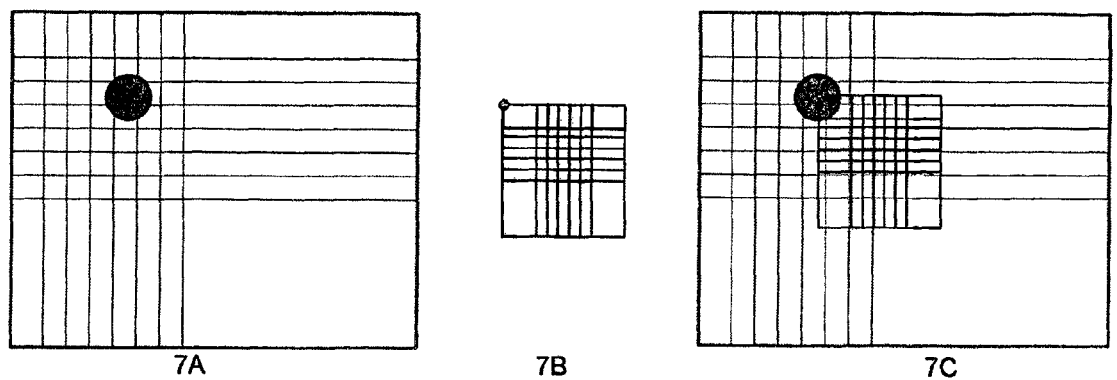
FIG. 7 is a schematic representation of the use of change in the optical image as created by an electron beam.

FIG. 7: When the electron beam is positioned on one specific point in the electron microscope image 7B, in the figure depicted by the circular dot in the top left corner, a change in the optical image is seen, in FIG. 7A the circular dot. i.e. in the left image. The observed size of the effect in the optical image is determined by the resolution of the optical microscope. However, the center of gravity of the large red dot can be determined with much higher accuracy then the resolution of the microscope using known per se techniques such as involving density values in a CCD recorded pattern, i.e. in fact in the optical image. With this method, it is possible to correlate the optical image and the electron image substantially more accurate than the resolution of the optical microscope.

The invention claimed is:

1. Method for correlating a charged particle microscope image and an optical image in an apparatus for inspecting a sample, said apparatus equipped with a charged particle column for producing a focused beam of charged particles to observe or modify the sample, and an optical microscope to simultaneously observe the same region of interest on the sample as is observed by the charged particle beam,
   wherein the method involves detecting a change in the optical image caused by the charged particle beam, and
   wherein the change in the optical image comprises a modification in luminescent or fluorescent light from the sample, or the generation of cathodoluminescence light by the charged particle beam falling on the sample.

2. Method according to claim 1, wherein the correlation is performed on one area on one sample and is extrapolated to the correlation on another area or on another sample.

3. Method according to claim 1, wherein the correlation parameters for different z-positions of a sample are stored, e.g. in the memory of a computer or processor, and retrieved when the sample is positioned on the corresponding z-position.

4. The alignment method of claim 1, wherein the method of alignment is used to correlate images acquired by an independent electron and optical microscope.

5. Apparatus for inspecting a sample, provided with a charged particle microscope having a column for producing a focused beam of charged particles to observe or modify the sample, and an optical microscope to observe a region of interest on the sample as is observed by the charged particle beam or vice versa, the apparatus accommodated with a detection and processing unit is adapted and equipped for acquiring an image as generated with said charged particle and said optical microscope, the unit is further adapted for performing an image alignment procedure mutually correlating the image coordinate systems of said images, wherein the apparatus is adapted for one of the group consisting of:
i) using a detection in the optical image of a modification in the luminescence or fluorescence as caused therein by the charged particle beam, for correlating said images, and
ii) using a detection in the optical image of the generation of cathodoluminescence light by the charged particle beam falling on the sample, for correlating said images.

6. The apparatus of claim 5, wherein the position is calculated using the determination of the center of mass of the changes.

7. Apparatus of claim 5, wherein the optical microscope and the charged particle microscope are arranged to simultaneously observe the same region of interest on the sample.

8. The apparatus of claim 5, wherein said change is an increase or a decrease in brightness at the position of the charged particle beam.

9. The apparatus of claim 5, wherein said change is a persistent effect, which is still detectable after the electron beam has been switched off.

10. The apparatus of claim 5, wherein the adaptation is provided for correlating images acquired by an independent electron and optical microscope.

11. The apparatus of claim 5, wherein said charged particle beam is scanned to form a pattern in the optical image.

12. The apparatus of claim 11, wherein said pattern consists of at least two sub-patterns at the corners of the electron image.

13. The apparatus of claim 5, wherein the procedure involves an automated recognition and interpretation of the change in the optical image caused by the electron beam.

14. The apparatus of claim 5, wherein a position of the change in the optical image as caused by the electron beam is calculated with a precision that is better than the optical resolution.

15. The apparatus of claim 5, wherein said change in the optical image as caused by the electron beam is used to calibrate the magnification of the optical image or the absolute dimensions in the image.

16. The apparatus of claim 5, wherein the correlation is determined and stored by the processing unit while the sample is maintained in place in the apparatus.

17. The apparatus of claim 5, wherein the apparatus is adapted for selecting a region of interest in either of the images of the two microscope systems for inspection of said area by the other system while the sample is maintained in place in the apparatus.

* * * * *